(12) United States Patent
Egitto et al.

(10) Patent No.: US 6,576,549 B2
(45) Date of Patent: Jun. 10, 2003

(54) FABRICATION OF A METALIZED BLIND VIA

(75) Inventors: Frank D. Egitto, Binghamton, NY (US); Elizabeth Foster, Friendsville, PA (US); Raymond T. Galasco, Binghamton, NY (US); David E. Houser, Apalachin, NY (US); Mark L. Janecek, Endicott, NY (US); Thomas E. Kindl, Endwell, NY (US); Jeffrey A. Knight, Endwell, NY (US); Stephen W. MacQuarrie, Vestal, NY (US); Voya R. Markovich, Endwell, NY (US); Luis J. Matienzo, Endicott, NY (US); Amarjit S. Rai, Vestal, NY (US); David J. Russell, Apalachin, NY (US); William T. Wike, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/282,275

(22) Filed: Oct. 28, 2002

(65) Prior Publication Data

US 2003/0054635 A1 Mar. 20, 2003

Related U.S. Application Data

(62) Division of application No. 09/670,968, filed on Sep. 27, 2000, now Pat. No. 6,522,014.

(51) Int. Cl.$^7$ ........................ H01L 21/31; H01L 21/469
(52) U.S. Cl. ........................ 438/678; 257/774; 438/639; 438/675; 438/677
(58) Field of Search ........................ 257/774; 438/639, 438/675, 677, 678

(56) References Cited

U.S. PATENT DOCUMENTS 3,163,588 A * 12/1964 Shortt et al. ................. 205/114
5,026,624 A 6/1991 Day et al. ................. 430/280.1

(List continued on next page.)

OTHER PUBLICATIONS

IBM Technical Disclosure Bulletin, vol. 14, No. 10, Mar. 1972, Laser Drilled Holes in Fired Ceramics, Fugardi et al., p. 2869.

(List continued on next page.)

Primary Examiner—Richard Elms
Assistant Examiner—Christian D. Wilson
(74) Attorney, Agent, or Firm—Schmeiser, Olsen & Watts; Lawrence R. Fraley

(57) ABSTRACT

A method and structure for forming a metalized blind via. A dielectric layer is formed on a metallic layer, followed by laser drilling a depression in the dielectric layer such that a carbon film that includes the carbon is formed on a sidewall of the depression. If the laser drilling does not expose the metallic layer, then an anisotropic plasma etching, such as a reactive ion etching (RIE), may be used to clean and expose a surface of the metallic layer. The dielectric layer includes a dielectric material having a carbon based polymeric material, such as a permanent photoresist, a polyimide, and advanced solder mask (ASM). The metallic layer includes a metallic material, such as copper, aluminum, and gold. The carbon film is in conductive contact with the metallic layer, and the carbon film is sufficiently conductive to permit electroplating a continuous layer of metal (e.g., copper) directly on the carbon film without need of an electrolessly plated layer underneath the electroplated layer. The laser drilling is accomplished using a laser radiation having a wavelength between about 180 nanometers and about 600 nanometers. The depression may have any cross-sectional shape and any spatial distribution of depths. As an example, the depression may include a blind via, a rectangular channel, or a combination thereof.

23 Claims, 7 Drawing Sheets

U.S. PATENT DOCUMENTS

| | | | | |
|---|---|---|---|---|
| 5,108,553 A | * | 4/1992 | Foster et al. | 205/125 |
| 5,180,609 A | | 1/1993 | Nakamura et al. | 427/595 |
| 5,593,606 A | | 1/1997 | Owen et al. | 219/121.71 |
| 5,633,207 A | * | 5/1997 | Yano et al. | 438/645 |
| 5,683,758 A | | 11/1997 | Evans et al. | 427/555 |
| 5,690,805 A | * | 11/1997 | Thorn et al. | 205/118 |
| 5,874,011 A | | 2/1999 | Ehrlich | 216/65 |
| 6,046,429 A | | 4/2000 | Datta | 219/121.69 |
| 6,313,026 B1 | * | 11/2001 | Huang et al. | 438/625 |
| 2002/0022365 A1 | * | 2/2002 | Ohba | 438/675 |

OTHER PUBLICATIONS

Proceedings of the EPC. European PCB Convention, Technical Conference, Proceedings 1998, P1–9, Micro Features [PCB technology], M. Cotton.

IBM Technical Disclosure Bulletin, vol. 30, No. 7, Dec. 1987, Nitrogen Enhanced Selectivity of Debris (Carbon–Rich Material) Versus Polyimide, Schwartz et al., pp. 128–129.

IBM Technical Disclosure Bulletin, vol. 20, No. 3, Aug. 1977, Ultrasonic Chemical Method of Cleaning Blind Holes in a Printed–Circuit Baord, Lo et al., p. 962.

Research Disclosure, Dec. 1988, No. 296, Avoiding Contamination in Laser Ablation of Polymers, Hodgson et al., Kenneth Mason Publications Ltd, England.

IBM Technical Disclosure Bulleting, vol. 21, No. 3, Aug. 1978, Hole Cleaning, Howrilka et al., p. 961.

IBM Technical Disclosure Bulletin, vol. 36, No. 02, Feb. 1993, Removal of Polyimide Laser Etch Debris by Wet Etching, Feger et al., p. 439.

IBM Technical Disclosure Bulletin, vol. 34, No. 4B, Sep. 1991, Elimination of Ablation Debris Contamination in Laser Etching of Polyimide Films, Srinivasan, (3 pages).

* cited by examiner

FABRICATION OF A METALIZED BLIND VIA

This application is a divisional of Ser. No. 09/670,968, filed on Sep. 27, 2000 now U.S. Pat. No. 6,522,014.

BACKGROUND OF THE INVENTION

1. Technical Field

The present invention relates to a method and structure for forming a metalized blind via.

2. Related Art

Electroplating a metal (e.g., copper) on a sidewall of a blind via in a dielectric layer, wherein an exposed metal layer is at a bottom end of the blind via, may be included within an overall process that forms conductive circuitry in (and on) an electronic structure such as a chip carrier. The electroplating process may be preceded by electrolessly plating the metal on the sidewall, and the electroless plating may be facilitated by first forming a layer of a seeding material (e.g., palladium) on the sidewall prior to the electroless plating. The electroless plating layer, and the associated seeding layer underneath, form a thin continuous layer as part of a closed conductive circuit that may be required for subsequent electroplating, but unfortunately add time and expense to the overall process.

There is a need for a method that enables a blind via to be electroplated without prior electroless plating.

SUMMARY OF THE INVENTION

The present invention provides a method for forming an electronic structure, comprising:

forming a dielectric layer on a metallic layer, wherein the dielectric layer includes a dielectric material having carbon, and wherein the metallic layer includes a metallic material; and laser drilling a depression in the dielectric layer such that a carbon film that includes the carbon is formed on a sidewall of the depression, wherein the carbon film is in conductive contact with the metallic layer, wherein the carbon film is sufficiently conductive to permit electroplating a continuous layer of metal directly on the carbon film, and wherein the laser drilling is with a laser radiation having a wavelength between about 180 nanometers and about 600 nanometers.

The present invention provides an electronic structure, comprising:

a metallic layer that includes a metallic material;

a dielectric layer on the metallic layer, wherein the dielectric layer includes a dielectric material having carbon; and a depression in the dielectric layer; and a carbon film on a sidewall of the depression, wherein the carbon film is in conductive contact with the metallic layer, and wherein the carbon film is sufficiently conductive to permit electroplating a continuous layer of metal directly on the carbon film.

The present invention enables a blind via to be electroplated without prior electroless plating.

DETAILED DESCRIPTION OF THE INVENTION

Figure 1:
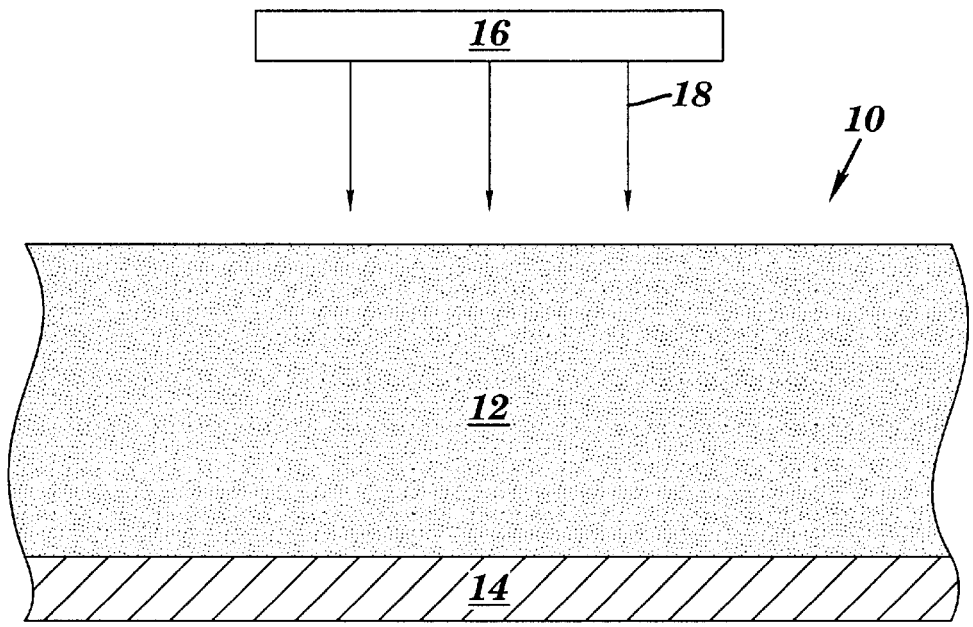
FIG. 1 depicts a front cross-sectional view of a substrate having a dielectric layer on a metallic layer, in accordance with embodiments of the present invention.

FIG. 1 illustrates a front cross-sectional view of a substrate 10 having a dielectric layer 12 on a metallic layer 14, in accordance with embodiments of the present invention. The metallic layer 14 includes a metallic material suitable for being electroplated. The metallic material may include, inter alia, copper, aluminum, palladium, or gold. The dielectric layer 12 includes a dielectric material having a hydrocarbon based polymeric material, such as, inter alia, a permanent photoresist, a polyimide, or an organic solder mask.

An example of an organic solder mask is Advanced Solder Mask (ASM). ASM is a photosensitive dielectric material known in the art. The ASM material includes an epoxy resin system consisting essentially of between about 10% and about 80% by weight of a polyol resin which is a condensation product of epichlorohydrin and bisphenol A having a molecular weight of between about 40,000 and 130,000; between about 20% and about 90% by weight of an epoxidized octafunctional bisphenol A formaldehyde novolak resin having a molecular weight of 4,000 to 10,000; and between about 35% and 50% by weight of an epoxidized glycidyl ether of tetrabromo bisphenol A having a melting point of between about 90° C. and about 110° C. and a molecular weight of between about 600 and 2,500 if flame resistant properties are desired. To this resin system is added about 0.1 to about 15 parts by weight per 100 parts of resin of a cationic photoinitiator capable of initiating polymerization of said epoxidized resin system upon exposure to actinic radiation.

Figure 2:
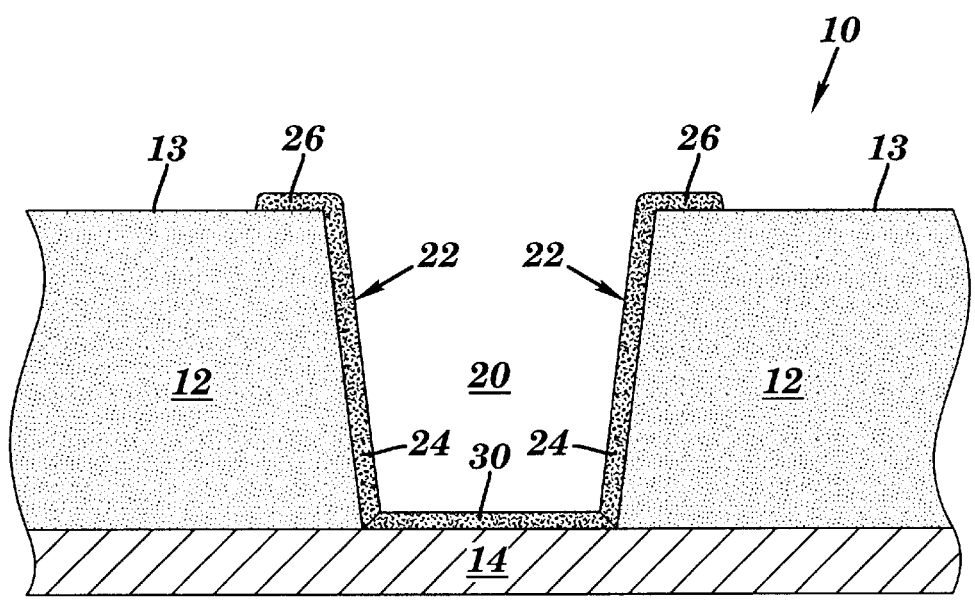
FIG. 2 depicts the substrate of FIG. 1 after a depression has been formed in the dielectric layer by laser radiation, resulting in a carbon film on a sidewall of the depression and a carbon layer at a bottom end of the depression.

In FIG. 1, a laser 16 emitting radiation 18 serves to form a depression in the dielectric layer 12 as will be illustrated and discussed infra in conjunction with FIG. 2. The laser 16 in FIG. 1 may include, inter alia, any of the following laser types: excimer, Nd:YAG, Nd:YLF, Nd:YAP, ND:YD04, or a YAG crystal doped with holmium or erbium. The preceding lasers form holes by moving the laser beam in spiraling motion. Defining a workpiece as an object to be ablated by the laser 16, examples of pertinent parameters of the laser 16 are as follows for the preceding list of lasers. A range of wavelength for the laser radiation 18 is about 180 nanometers to about 600 nanometers. Z-offset is a distance above or below the workpiece at which the laser beam is focused, and a range for Z-offset is about −4 mm to about +4 mm, wherein a negative Z-offset corresponds to a focus below the workpiece, and wherein a positive Z-offset corresponds to a focus above the workpiece. A bite size is a center-to-center distance between successive laser pulses, and a range for bite size is about 0 microns to about 40 microns. A repetition rate is a number of laser pulses delivered to the workpiece per unit time, and a range for repetition rate is about 25 Hz to about 20,000 Hz. Effective spot size is a diameter of the laser beam on the workpiece, and a range for the effective spot size is about 2 microns to about 300 microns. Other types of lasers (and associated laser parameters ranges) capable of forming the depression may also be used, wherein the other types of lasers may have motions other than the spiraling motion of the preceding lasers, or be stationary (i.e., no motion).

FIG. 2 illustrates the substrate 10 of FIG. 1 after a depression 20 has been formed in the dielectric layer 12 by the laser radiation 18, resulting in a carbon film 22 that includes carbon from the dielectric material of the dielectric layer 12. The carbon film is 22 is sufficiently continuous in electrical characteristics to allow subsequent electroplating. The carbon film 22 includes a portion 24 and a portion 26. The portion 24 of the carbon film 22 is on a sidewall of the depression 20. The portion 26 of the carbon film 22 is on a top surface 13 of the dielectric layer 12. The portion 24 results from redeposition or carbonization of the dielectric material that is laser-ablated near the top surface 13 of the dielectric layer 12, and may not exist for some laser types or laser parameters used in forming the depression 20, since the type of laser and laser parameters affect the motion of the dielectric material that is laser-ablated.

FIG. 2 also shows a cover layer 30 at a bottom end of the depression 20, said cover layer 30 covering a portion of the metallic layer 14. The cover layer 30 may or may not exist, depending whether the laser 16 (see FIG. 1) ablates dielectric material from the top surface 13 all the way down to the metallic layer 14. If the laser ablation extends to the metallic layer 14, then the cover layer 30 exists if debris resulting from the laser ablation deposits on the metallic layer 14. If the laser radiation 16 (see FIG. 1) ablates dielectric material down to the metallic layer 14, but without depositing laser-generated debris on the metallic layer 14, then the cover layer 30 does not exist. Thus, if the cover layer 30 exists, then the cover layer 30 includes the dielectric material, carbon from the dielectric material, or a combination thereof.

Figure 3:
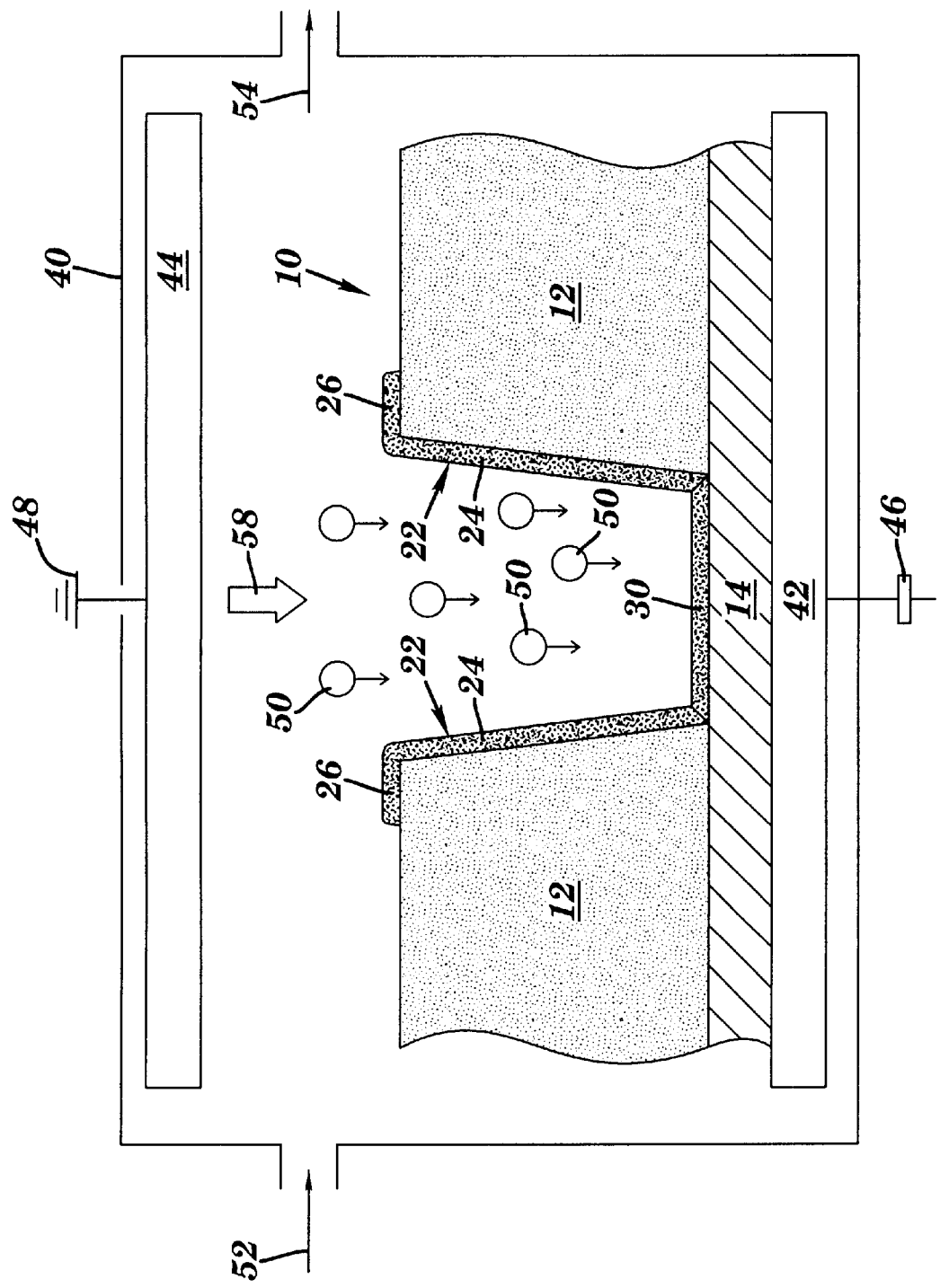
FIG. 3 depicts the substrate of FIG. 2 in a reactive ion etch (RIE) plasma chamber for etching away the carbon layer.

FIG. 3 illustrates the substrate 10 of FIG. 2 in an reactive ion etch (RIE) plasma chamber 40 for the purpose etching away the carbon layer 30. The RIE plasma chamber 40 includes an electrode 42 electrically connected to a power source 46, and an electrode 44 electrically connected to a ground 48. The substrate 10 rests on the electrode 42. A gas 52 enters the plasma chamber 40 at a volumetric flow rate between about 100 scc/minute and about 1000 scc/minute, wherein scc stands for cubic centimeters at standard temperature and pressure (i.e., at 0° C. and 14.7 psia). The gas 54 exits the plasma chamber 40 as shown. The gas pressure in the plasma chamber 40 is between about 1 milliTorr and about 400 milliTorr. Voltage from the power source 46 ionizes the gas 52 into ions 50 and directs said ions 50 in a direction 58 toward the cover layer 30 so as to etch away the cover layer 30. The magnitude of electrical power from the power source 46 affects a rate of material removal by the RIE process. For example, about 0.25 watts/cm$^2$ of incident ions on a polyimide target has been found to remove about 0.5 microns of polyimide thickness in about 6 minutes. An angular distribution of flow of the ions 50 is essentially in the direction 58 with a negligible component, if any, perpendicular to the direction 58. As a result of the aforementioned directionality of the flow of the ions 50, the ions 50 do not materially attack the carbon film 22 and leave the carbon film 22 intact. Thus, a significant characteristic of the plasma chamber 40 is that it causes a highly anisotropic etching of the cover layer 30 in direction 58. While FIG. 3 depicts the RIE plasma chamber 40, the present invention may employ any type of plasma chamber capable of etching anisotropically with ions moving primarily toward the cover layer 30 in the direction 58 with little or no directional component normal to direction 58. Other types of plasma chambers resulting in anisotropic etching of the cover layer 30 in direction 58 could be used. Additionally, if the cover layer 30 included a porous layer of carbon (e.g., a web of carbon), the metallic layer 14 could be microetched in, inter alia, persulphate or cuprous chloride, followed by washing away the cover layer 30, without attacking the portions 24 and 26 of the carbon film 22.

The depression 20 in FIG. 2 or FIG. 3 may have any geometric shape, including any spatial distribution of depths. As an example, the depression 20 may include a blind via, a rectangular channel, or a combination thereof. If the depression 20 includes a blind via, then the blind via may have any cross-sectional shape, such as circular or non-circular (e.g., polygonal, rectangular, elliptical, slotted, etc.), with vertical sidewalls or sloped sidewalls. The cross-sectional shape pertains to the cross-sectional plane of the blind via such that the cross-sectional plane is parallel to the top surface 13 of the dielectric layer 12 (see FIG. 2). If anisotropic plasma etching is used as discussed supra in conjunction with FIG. 3, however, then a small slope of the blind via sidewalls may enable an ion flow component normal to the portion 24 of the carbon film 22 to be of sufficiently small magnitude so as not to etch away the portion 24.

Figure 9:
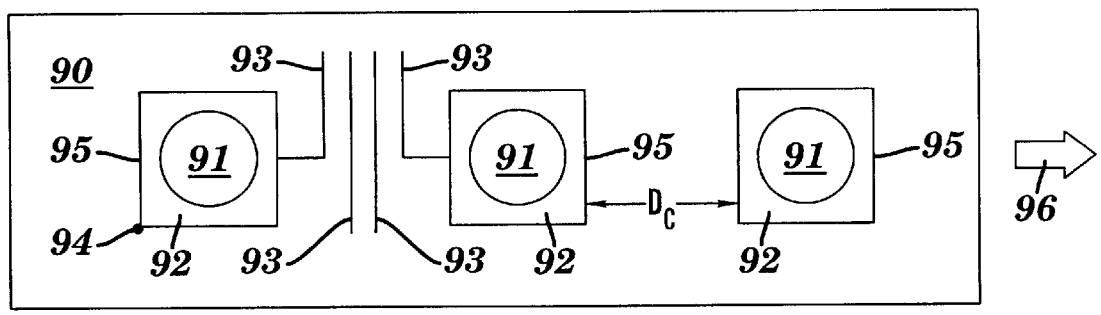
FIG. 9 illustrates a top view of a substrate having circular blind vias, in accordance with embodiments of the present invention.
Figure 10:
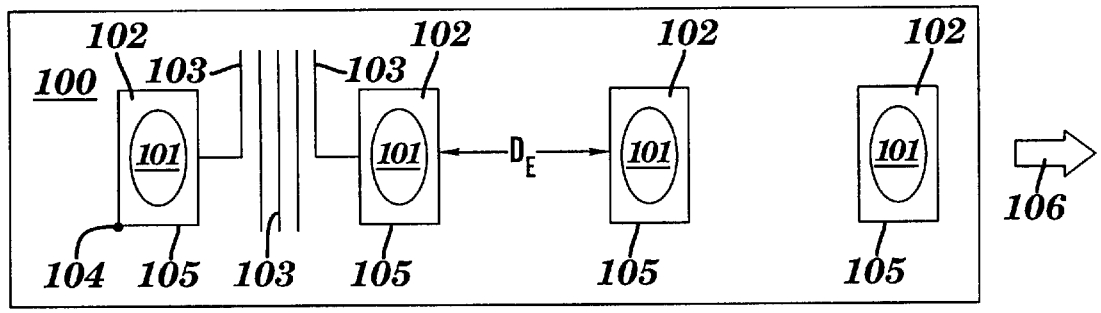
FIG. 10 illustrates a top view of a substrate having elliptical blind vias, in accordance with embodiments of the present invention.
Figure 11:
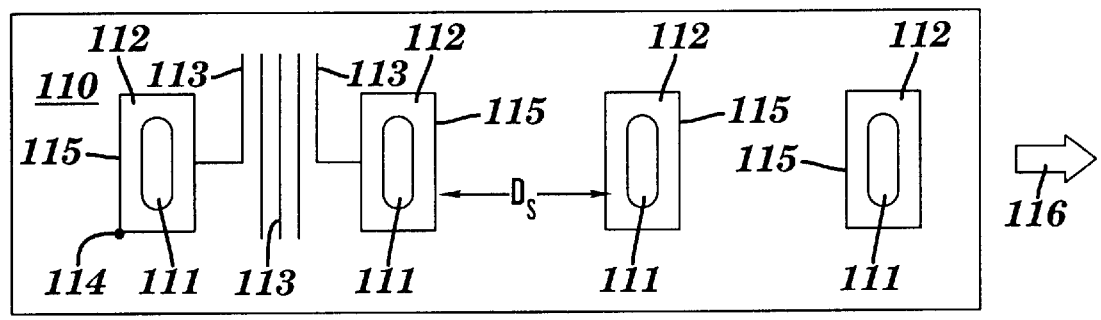
FIG. 11 illustrates a top view of a substrate having slotted blind vias, in accordance with embodiments of the present invention.

The aforementioned circular blind vias, elliptical blind vias, and slotted blind vias (differentiated in accordance with cross-sectional shape) have distinctive characteristics as illustrated in FIGS. 9, 10, and 11, respectively, in accordance with embodiments of the present invention. FIG. 9 illustrates a top view of a substrate 90 having circular blind vias 91 in conductive contact with surrounding conductive lands 92, wherein the lands 92 are separated by a distance $D_C$ in a direction 96. Conductive wiring 93 is located between the blind vias 91. The lands 92 have an approximately square shaped perimeter 95 with sharp or rounded corners 94. Alternatively, the lands 92 may have an approximately circular shape.

FIG. 10 illustrates a top view of a substrate 100 having elliptical blind vias 101 in conductive contact with surrounding conductive lands 102, wherein the lands 102 are separated by a distance $D_E$ in a direction 106. Conductive wiring 103 is located between the blind vias 101. The lands 102 have a rectangular shaped perimeter 105 with sharp or rounded corners 104. Alternatively, the lands 102 may have an elliptical shape. A reduced width of each elliptical blind via 101 in the direction 106, in contrast with the radius of each circular blind via 91 in FIG. 10, enables a higher density of blind vias, a higher density of conductive wiring between blind vias, or both, for the elliptical blind vias 101 of FIG. 10 than for the circular blind vias 91 of FIG. 9, depending on the relative values of $D_E$ and $D_C$.

FIG. 11 illustrates a top view of a substrate 110 having slotted blind vias 111 in conductive contact with surrounding conductive lands 112, wherein the lands 112 are separated by a distance $D_S$ in a direction 116. Conductive wiring 113 is located between the blind vias 111. The lands 112 have a rectangular shaped perimeter 115 with sharp or rounded corners 114. Alternatively, the lands 112 may have an elliptical shape. The slotted blind vias 111 are characterized by parallel sides with arcs at the ends. As a radius of curvature of the small arcs at the ends approach infinity, the shape of the slotted blind via 111 approaches a rectangular shape. Thus a rectangular blind via is within the scope of the slotted blind via 111. A reduced width of each slotted blind via 111 in the direction 116, in contrast with the radius of each circular blind via 91 in FIG. 10, enables a higher density of blind vias, a higher density of conductive wiring between blind vias, or both, for the slotted blind vias 111 of FIG. 10 than for the circular blind vias 91 of FIG. 9, depending on the relative values of $D_S$ and $D_C$.

Figure 4:
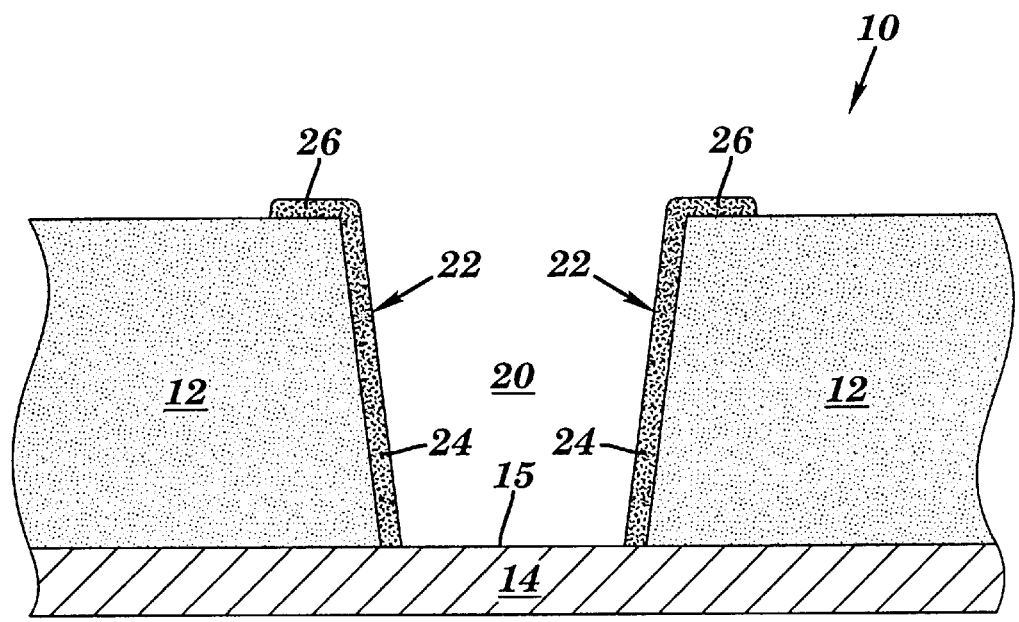
FIG. 4 depicts the substrate of FIG. 3 after the cover layer has been etched away.

FIG. 4 illustrates the substrate 10 of FIG. 3 after the cover layer 30 has been etched away (i.e., removed). FIG. 4 may also represent FIG. 2 for the case in which the cover layer 30 does not exist. With the cover layer 30 removed or non-existent, a portion of the metallic layer 14 is exposed at a bottom end of the depression 20, and a surface 15 of the metallic layer 14 is ready to be electroplated at the exposed portion of the metallic layer 14.

Figure 5:
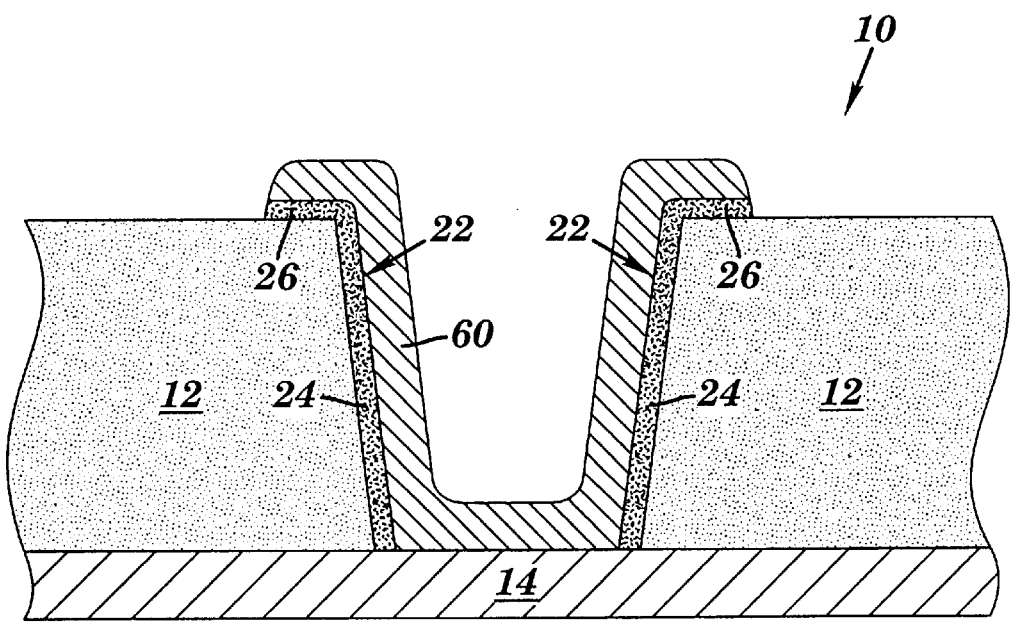
FIG. 5 depicts the substrate of FIG. 4 after a layer of metal has been electroplated on the carbon film.

FIG. 5 illustrates the substrate 10 of FIG. 4 after a continuous layer of metal 60 has been electroplated directly on the carbon film 22, wherein "directly" means without need of an intervening electrolessly plated metal film underneath the electroplated layer of metal 60. The aforementioned electroplating can be accomplished, because the metallic layer 14 acts as a commoning layer, and the carbon film 22 is sufficiently conductive to permit electroplating the layer of metal 60 directly on the carbon film 22 without need of the intervening electrolessly plated metal film underneath the electroplated layer of metal 60. The layer of metal 60 may include, inter alia, copper or nickel. For electroplating with copper, the electroplating may use phosphorized copper anodes, may occur under a current density of about 15 ampS/ft$^2$ to about 25 amps/ft$^2$ (i.e., amperes per square foot of plated surface), and may use an acid copper bath. The acid copper bath may include such components as: sulfuric acid having a concentration between about 150 grams/liter and about 250 grams/liter, a chloride having a concentration between about 30 ppm and about 100 ppm, a copper ion concentration between about 15 grams/liter and about 25 grams/liter, and such organic additives (e.g., cupracid HY 70/30 produced by the Ethone IONO company). Vigorous agitation of the acid copper bath may be employed to better wet the depression 20 surfaces being electroplated. Prior to the electroplating, the depression 20 may be wetted, such as with ammonium hydroxide, to facilitate good contact between the acid copper bath and the depression 20 surfaces to be subsequently electroplated.

Figure 6:
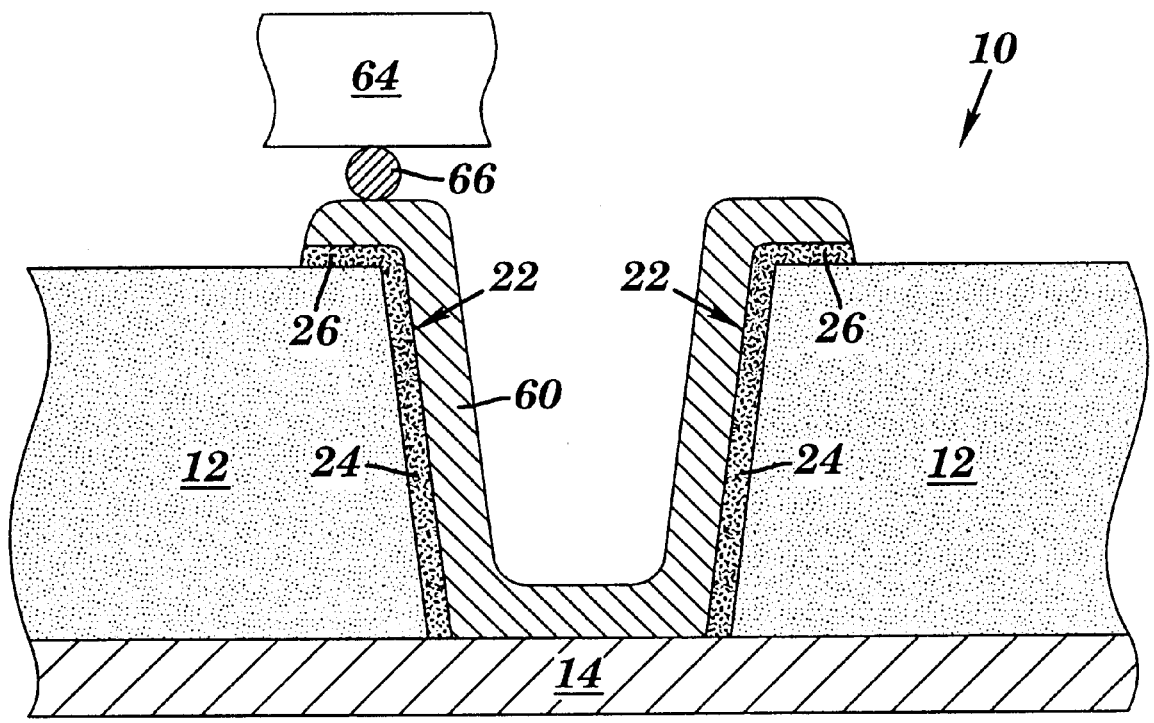
FIG. 6 depicts the substrate of FIG. 5 after an electronic device has been conductively coupled to the layer of metal.

FIG. 6 illustrates the substrate 10 of FIG. 5 after an electronic device 64 has been conductively coupled to the layer of metal 60 by a conductive interface 66. As an example, the electronic device 64 may include, inter alia, a semiconductor chip, and the conductive interface 66 may include, inter alia, a controlled collapse chip connection (C4) solder ball.

Figure 7:
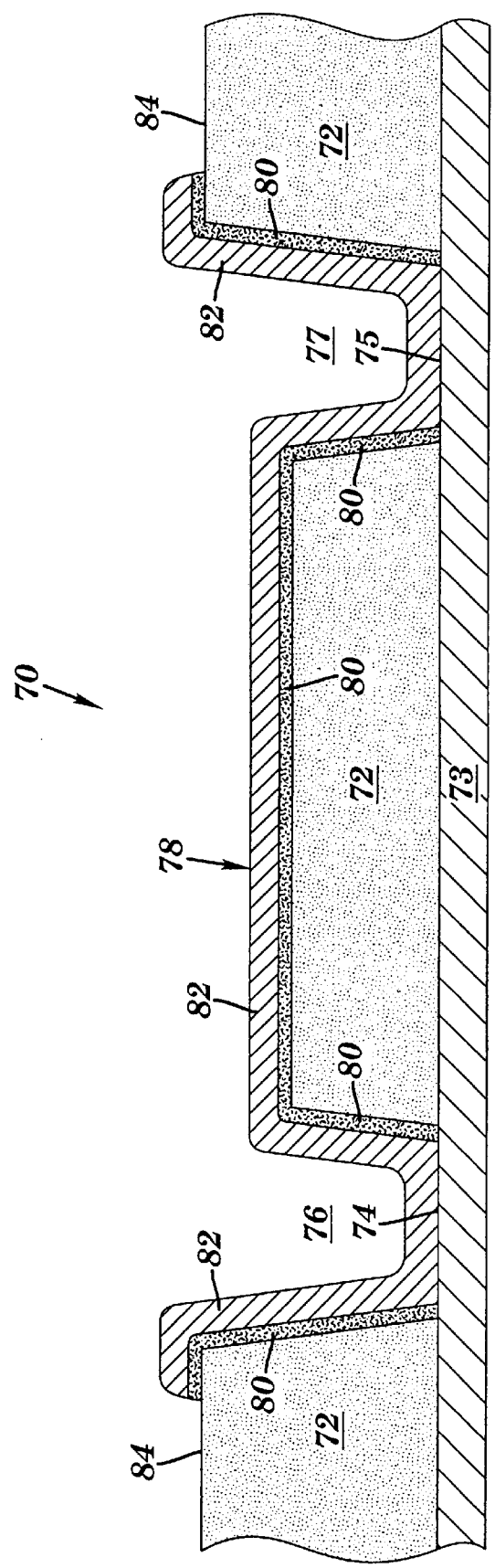
FIG. 7 depicts a front cross-sectional view of an electronic structure having a first plated blind via, a plated channel coupled to the first plated blind via, and a second plated blind via conductively coupled to the plated channel, in accordance with embodiments of the present invention.

As an example of the variety of possible shapes of a depression of the present invention (e.g., the depression 20 in FIG. 3), FIG. 7 illustrates a front cross-sectional view of an electronic structure 70, in accordance with embodiments of the present invention. A depression in FIG. 7 illustrates how the depression cross-sectional geometry and a depth of the depression may vary spatially. The electronic structure 70 includes a dielectric layer 72 on a metallic layer 73. The electronic structure 70 also includes the depression, comprising: a first plated blind via 76 in the dielectric layer 72, a plated channel 78 on the dielectric layer 72 and conductively coupled to the first plated blind via 76, and a second plated blind via 77 in the dielectric layer 72 and conductively coupled to the plated channel 78. The first plated blind vias 76 and the second plated blind via 77 may each have any shape (e.g., circular, elliptical, or polygonal), and any depth beneath a top surface 84 of the dielectric layer 72. The depth of the first plated blind vias 76 may differ from the depth of the second plated blind vias 77. The plated channel 78 may have any shape, such as rectangular, and any depth beneath the top surface 84 of the dielectric layer 72. The depth of the plated channel 78 may differ from the depth of the first plated blind via 76 and/or the second plated blind via 77. In the example illustrated in FIG. 7, the depth of the plated channel 78 is less than the depth of both the first plated blind via 76 and the second plated blind via 77.

In FIG. 7, a carbon film 80 is formed: on a sidewall of the first plated blind via 76, on a surface of the dielectric layer 72 beneath the plated channel 78, and on a sidewall of the second plated blind via 77. The dielectric layer 72, the metallic layer 73, and the carbon film 80 have a same composition and characteristics as the dielectric layer 12, the metallic layer 14, and the carbon film 22, respectively, described supra in conjunction with FIGS. 1 and 2. The first plated blind via 76, the second plated blind via 77, and the plated channel 78 each includes the layer of metal 82 electroplated directly on the carbon film 80. Prior to being electroplated, the first plated blind via 76 is a first unplated blind via, the plated channel 78 is an unplated channel, and the second plated blind via 77 is a second unplated blind via. The carbon film 80 is formed by a same laser ablation methodology that formed the carbon film 22 described supra in conjunction with FIG. 2, and said same laser ablation methodology forms the first unplated blind via, the unplated channel, and the second unplated blind via. The first unplated blind via, the unplated channel, and the second unplated blind via, together with corresponding portions of the carbon film 80 (on the sidewall of the first plated blind via 76, on the surface of the dielectric layer 72 beneath the plated channel 78, and on the sidewall of the second plated blind via 77), may be formed concurrently or sequentially. The layer of metal 82 is formed by a same methodology that formed the layer of metal 60, and has a same composition and characteristics as the layer of metal 60, described supra in conjunction with FIG. 5.

The plated channel 78 may serve as a conductive circuit line formed without need of an intervening electroless plating layer and without need of photolithography. In the related art, surface circuit lines may be formed photographically by forming a conductive sheet of metal (e.g., copper) over a top surface of a dielectric structure, patterning photoresist over the conductive sheet, exposing the patterned conductive sheet to ultraviolet radiation, etching away unexposed metal of the conductive sheet, and removing exposed photoresist, resulting in a remaining conductive sheet material that becomes the conductive circuit line. The method of the present invention for forming the plated channel 78 may be generally used to form a surface circuit line without blind vias, providing that a commoning metalization is conductively coupled to a laser-formed channel (with a carbon film thereon) of the surface circuit line. While the commoning metalization may comprise a blind via with a metallic layer at a bottom end of the blind via, as with the depression 20 in FIG. 4 or the depression in FIG. 7, any commoning metalization will suffice, such as surface metal pads or metal lands conductively coupled to the carbon film of the laser-formed channel.

Figure 8:
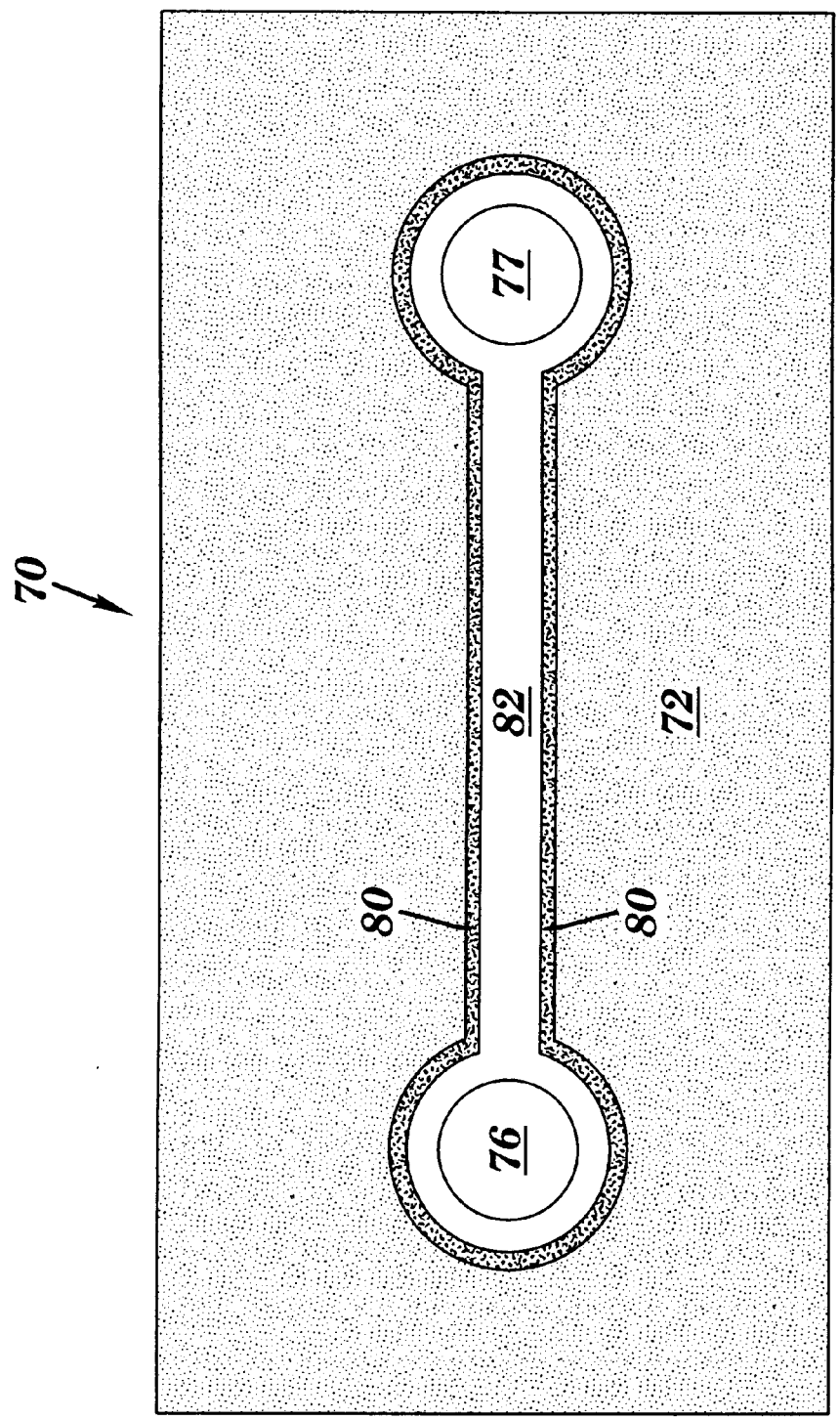
FIG. 8 depicts a top view of the electronic structure of FIG. 7.

FIG. 8 illustrates a top view of the electronic structure 70 of FIG. 7.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for forming an electronic structure, comprising:

forming a dielectric layer on a metallic layer, wherein the dielectric layer includes a dielectric material having carbon, and wherein the metallic layer includes a metallic material; and laser drilling a depression in the dielectric layer such that a carbon film is formed on a sidewall of the depression, wherein the carbon film consists essentially of the dielectric material, wherein the carbon film is in conductive contact with the metallic layer, wherein the carbon film is sufficiently conductive to permit electroplating a continuous layer of metal directly on the carbon film.

2. The method of claim 1, wherein the step of laser drilling exposes the metallic layer.

3. The method of claim 1, further comprising after the step of laser drilling, anisotropically plasma etching into the blind via so as to clean and expose a surface of metallic layer while leaving the carbon film intact.

4. The method of claim 3, wherein the plasma etching includes reactive ion etching (RIE).

5. The method of claim 1, further comprising electroplating the continuous layer of metal directly on the carbon film and on the metallic layer.

6. The method of claim 5, wherein continuous layer of metal includes a plating metal selected from the group consisting of copper and nickel.

7. The method of claim 1, wherein the dielectric material includes a hydrocarbon based polymeric material.

8. The method of claim 1, wherein the dielectric material is selected from the group consisting of a permanent photoresist, a polyimide, advanced solder mask (ASM), and combinations thereof.

9. The method of claim 1, wherein the metallic material includes a metal selected from the group consisting of copper, aluminum, palladium, and gold.

10. The method of claim 1, wherein the depression includes a blind via with sidewalls selected from the group consisting of vertical sidewalls and sloped sidewalls, and wherein a portion of the metallic layer is at a bottom end of the blind via.

11. The method of claim 10, wherein the blind via has a circular cross-sectional shape.

12. The method of claim 10, wherein the blind via has a non-circular cross-sectional shape.

13. The method of claim 12, wherein the non-circular cross-sectional shape is selected from the group consisting of an elliptical cross-sectional shape and a slotted cross-sectional shape.

14. The method of claim 1, wherein the depression includes a first blind via, a channel connected to the first blind via, and a second blind connected to the channel, wherein a first portion of the metallic layer is at a bottom end of the first blind via, and wherein a second portion of the metallic layer is at a bottom end of the second blind via.

15. The method of claim 14, wherein the first blind via has an approximately circular cross section, wherein the channel has an approximately rectangular cross section, and wherein the second first blind via has an approximately circular cross section.

16. The method of claim 14, wherein a depth of the first blind via exceeds a depth of the channel, and wherein a depth of the second blind via exceeds the depth of the channel.

17. The method of claim 1, wherein the depression includes a channel.

18. The method of claim 17, further comprising electroplating the continuous layer of metal directly on the carbon film and on the metallic layer to form a conductive circuit line in the channel.

19. The method of claim 1, wherein the step of laser drilling further forms the carbon film such that a first portion of the carbon film is on a top surface of the dielectric layer, and wherein the first portion of the carbon film is in conductive contact with a second portion of the carbon film that is on the sidewall of the depression.

20. The method of claim 19, further comprising electroplating the continuous layer of metal directly on the carbon film and on the metallic layer.

21. The method of claim 20, further comprising conductively coupling an electronic device to the continuous layer of metal.

22. The method of claim 21, wherein the electronic device includes a semiconductor chip.

23. The method of claim 21, wherein the laser drilling is with a laser radiation having a wavelength between about 180 nanometers and about 600 nanometers.

* * * * *